(12) United States Patent
Han (10) Patent No.: US 8,513,056 B2
(45) Date of Patent: Aug. 20, 2013

(54) SEMICONDUCTOR MEMORY DEVICE AND METHOD OF FABRICATING THE SAME

(75) Inventor: Jae-Hwan Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 653 days.

(21) Appl. No.: 12/659,150

(22) Filed: Feb. 26, 2010

(65) Prior Publication Data

US 2010/0224973 A1 Sep. 9, 2010

(30) Foreign Application Priority Data

Mar. 9, 2009 (KR) ................... 10-2009-0019952

(51) Int. Cl.
*H01L 21/50* (2006.01)
(52) U.S. Cl.
USPC ..... 438/106; 438/118; 438/125; 257/E23.193
(58) Field of Classification Search
USPC ................ 438/119, 125, 126, 118, 106, 456; 257/E23.193
See application file for complete search history.

(56) References Cited

U.S. PATENT DOCUMENTS

| | | | |
|---|---|---|---|
| 5,061,845 A | 10/1991 | Pinnavaia | |
| 7,008,240 B1 * | 3/2006 | Wang et al. | 439/76.1 |
| D537,824 S | 3/2007 | Day et al. | |
| 7,433,196 B1 * | 10/2008 | Wang et al. | 361/752 |
| 2004/0040871 A1 * | 3/2004 | Kakinoki et al. | 206/307 |
| 2006/0128231 A1 | 6/2006 | Hsiao | |

FOREIGN PATENT DOCUMENTS

| | | |
|---|---|---|
| JP | 2001-175834 | 6/2001 |
| JP | 2008-146375 | 6/2008 |

* cited by examiner

*Primary Examiner* — Michael Trinh
(74) *Attorney, Agent, or Firm* — Harness, Dickey & Pierce, P.L.C.

(57) ABSTRACT

Provided is a semiconductor device and method of fabricating the semiconductor memory device. The semiconductor device may be formed by forming a first welding groove along outside edges of one case of a pair of upper and lower cases, forming a first welding protrusion along outside edges of the other case, the first welding protrusion being formed to correspond to the first welding groove and having a volume larger than a volume of the first welding groove. The method may further include inserting the first welding protrusion into the first welding groove to enclose a memory module in an inner accommodating space of the upper and lower cases, melting the first welding protrusion so that a first portion of the first welding protrusion fills the first welding groove and a second portion of the first welding protrusion fills a space between welding portions of the upper case and the lower case, and solidifying the first and second portions of the first welding protrusion.

12 Claims, 11 Drawing Sheets

SEMICONDUCTOR MEMORY DEVICE AND METHOD OF FABRICATING THE SAME

CROSS-REFERENCE TO RELATED APPLICATIONS

This application claims priority under 35 U.S.C. §119 to Korean Patent Application 10-2009-0019952, filed on Mar. 9, 2009, in the Korean Intellectual Property Office (KIPO), the entire contents of which are herein incorporated by reference.

BACKGROUND

1. Field

Example embodiments of inventive concepts relate to a semiconductor memory device and a method of fabricating the same, and more particularly, to a memory card that may be used as a storage device in which a semiconductor device is provided and a method of fabricating the memory card.

2. Description of the Related Art

A memory card, for example, an SD card, is one of many memory devices that may store a relatively large amount of image information, speech information or other information in a semiconductor memory device (for example, a flash memory). Because the memory card directly and electrically accesses information to a nonvolatile memory formed in a memory device, it does not need a mechanical system unlike known storage devices and therefore the writing and reading operations are relatively fast. In addition, because the memory card is relatively small and light, it has relatively good portability. Accordingly, the memory card is primarily used as an auxiliary memory device in the digital appliances, which need portability, for example, a personal computer, a cellular phone, or a digital camera.

SUMMARY

Example embodiments of inventive concepts provide a semiconductor memory device, which may have improved mechanical strength and durability, and a method of fabricating the same.

In accordance with example embodiments of inventive concepts, a method of fabricating a semiconductor memory device may include forming a first welding groove along outside edges of one case of a pair of upper and lower cases, forming a first welding protrusion along outside edges of the other case, the first welding protrusion being formed to correspond to the first welding groove and having a volume larger than a volume of the first welding groove. The method may further include inserting the first welding protrusion into the first welding groove to enclose a memory module in an inner accommodating space of the upper and lower cases, melting the first welding protrusion so that a first portion of the first welding protrusion fills the first welding groove and a second portion of the first welding protrusion fills a space between welding portions of the upper case and the lower case, and solidifying the first and second portions of the first welding protrusion.

In accordance with example embodiments of inventive concepts, a method of fabricating a semiconductor memory device may include welding a pair of upper and lower cases to each other to enclose a memory module in an inner accommodating space of the upper and lower cases, wherein welding the pair of upper and lower cases to each other includes inserting a welding protrusion formed on one of the cases of the pair of the upper and lower cases into a welding groove formed in the other of the pair of the upper and lower cases and melting the welding protrusion to fill the welding groove.

In accordance with example embodiments of inventive concepts, a method of fabricating a semiconductor memory device may include forming a welding groove along outside edges of any one of a pair of upper and lower cases, forming a welding protrusion along outside edges of the other case so as to have a volume larger than that of the welding groove at a position facing the welding groove, melting the welding protrusion in a state where a leading end of the welding protrusion is inserted into the welding groove so as to hold a memory module mounting semiconductor devices in a space between the upper and lower cases, filling a melt of the welding protrusion in the welding groove and between welding surfaces on the edges of the upper and lower cases, and joining the upper and lower cases by solidifying the melt of the welding protrusion.

In Example embodiments of inventive concepts, inner welding walls may be protruded and formed at an inner side of the outside edges of the upper and lower cases so as to face each other and facing surfaces of the inner welding walls may be joined to each other by welding. In addition, the welding groove may be formed in any one of the facing surfaces of the inner welding walls, and the welding protrusion may be formed in the other facing surface, and the welding protrusion may have a larger volume than the welding groove.

In example embodiments of inventive concepts, the inner welding walls may be provided as a separation wall that partitions the inner accommodating space into a holding space and a non-holding space of the memory module.

In example embodiments of inventive concepts, strength reinforcing ribs may be protruded and formed at the upper and lower cases corresponding to the non-holding space of the memory module.

In example embodiments of inventive concepts, the ribs formed at the upper and lower cases may be protruded and formed to face each other, and facing surfaces of the ribs may be joined to each other by the welding. Moreover, the welding groove may be formed in one of the facing surfaces of the ribs, and the welding protrusion may be formed in the other facing surface, and the welding protrusion may have larger volume than the welding groove.

In example embodiments of inventive concepts, the ribs may include a plurality of first ribs disposed so as to be horizontal in a longitudinal direction. In accordance with example embodiments of inventive concepts, the plurality of first ribs may be spaced apart from one another in parallel. In accordance with example embodiments of inventive concepts a plurality of second ribs may be disposed so as to be perpendicular to the first ribs and be spaced apart from one another in parallel.

In example embodiments of inventive concepts, the ribs may further include third ribs disposed so as to connect intersection points, which are located at a diagonal direction, among intersection points between the first ribs and the second ribs.

In example embodiments of inventive concepts, the ribs may include a first rib disposed to be perpendicular to the inner welding wall and partition a region of the upper and lower cases corresponding to the non-holding space of the memory module, second ribs disposed adjacently at both sides of the first rib along a longitudinal direction and having a diamond shape, third ribs connecting antipodes of the second ribs, and fourth ribs passing through contacts of the second ribs and disposed in a horizontal direction.

In example embodiments of inventive concepts, a metallic plate-shaped reinforcing member may be inserted into any one of the upper and lower cases corresponding to the non-holding space of the memory module, and the ribs may penetrate the reinforcing member and may be spaced apart from one another in parallel.

Example embodiments of inventive concepts also provide a semiconductor memory device that may include a pair of upper and lower cases joined to each other by a welding and a memory module held in an inner accommodating space of the upper and lower cases to mount semiconductor devices. In example embodiments of inventive concepts, a welding groove may be formed in any one welding surface of the upper and lower cases, and a junction portion welded between the upper and lower cases may be filled in the welding groove and between the welding surfaces of the upper and lower cases.

BRIEF DESCRIPTION OF THE DRAWINGS

The accompanying drawings are included to provide a further understanding of example embodiments of inventive concepts, and are incorporated in and constitute a part of this specification. The drawings illustrate example embodiments of inventive concepts and, together with the description, serve to explain principles of the inventive concept. In the drawings.

DETAILED DESCRIPTION OF EXAMPLE EMBODIMENTS OF INVENTIVE CONCEPTS

Example embodiments of inventive concepts will now be described more fully with reference to the accompanying drawings, in which example embodiments of inventive concepts are shown. The invention may, however, be embodied in different forms and should not be construed as limited to of example embodiments of inventive concepts set forth herein. Rather, example embodiments of inventive concepts are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments of inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of inventive concepts described herein will refer to plan views and/or cross-sectional views by way of ideal schematic views. Accordingly, the views may be modified depending on manufacturing technologies and/or tolerances. Therefore, example embodiments of inventive concepts are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments of inventive concepts.

A semiconductor memory device and a method of fabricating the semiconductor memory device according to example embodiments of inventive concepts will be described below in more detail with reference to the accompanying drawings. First, it is to be noted that the same elements are indicated with the same reference numerals throughout the drawings. For the purposes of clarity and simplicity, well-known functions or constructions are not described in detail as they would obscure the invention in unnecessary detail.

Figure 1:
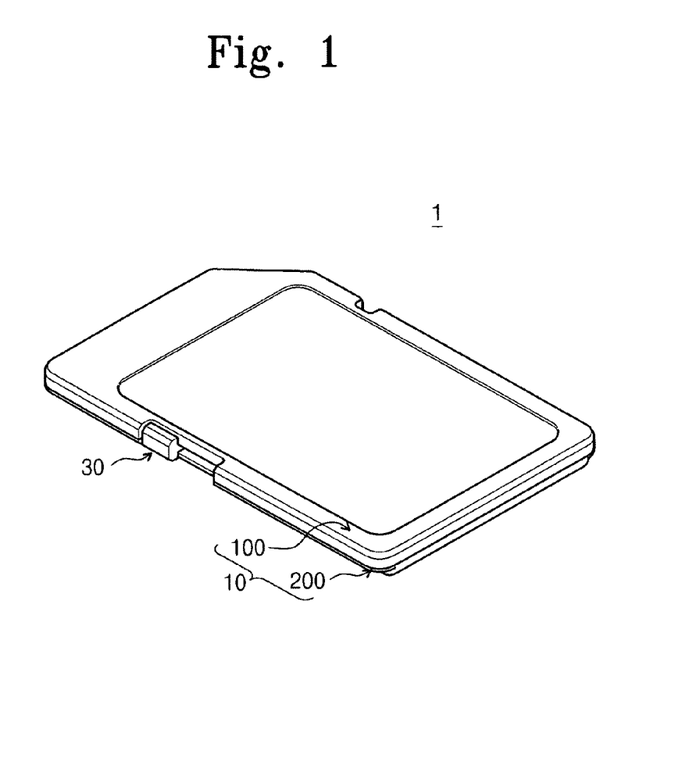
FIG. 1 is a perspective view illustrating a semiconductor memory device according to example embodiments of inventive concepts.
Figure 2:
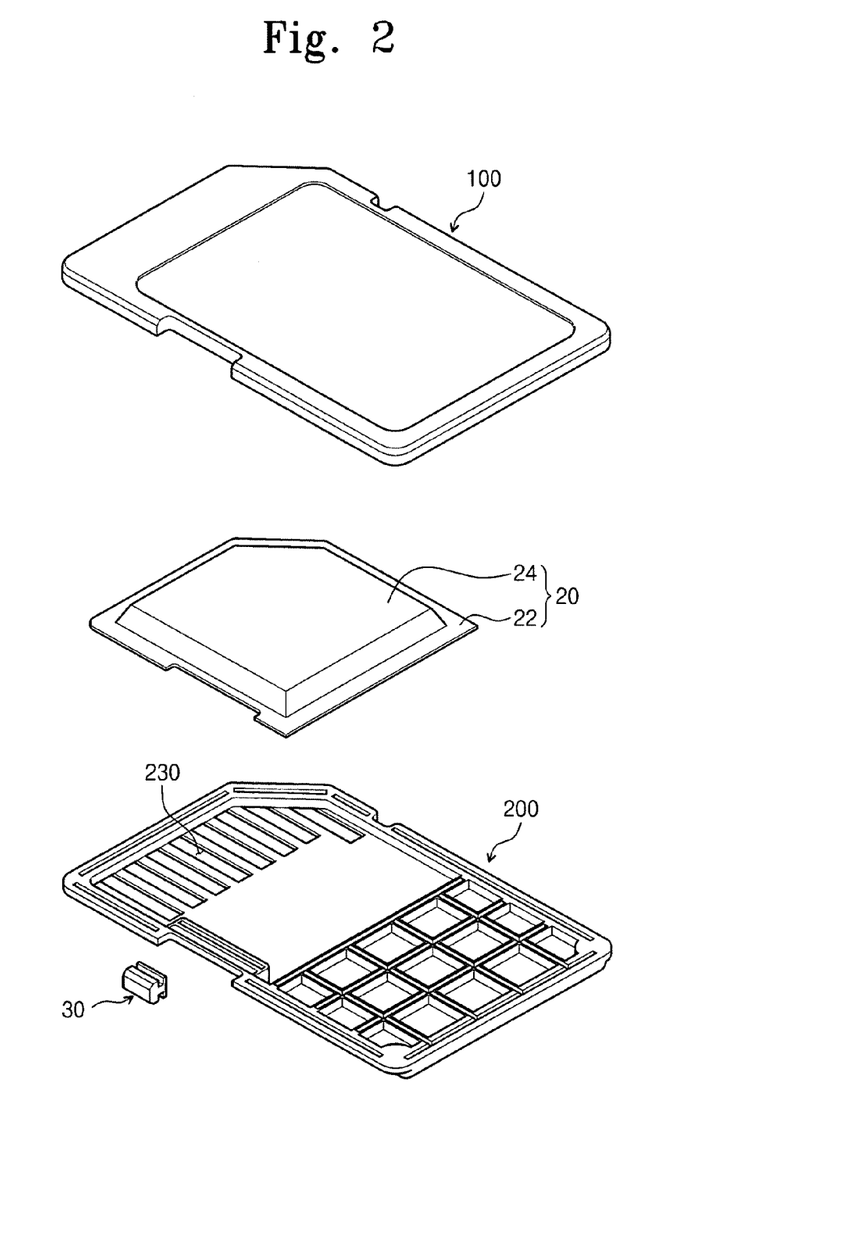
FIG. 2 is an exploded perspective view illustrating the semiconductor memory device illustrated in FIG. 1.

FIG. 1 is a perspective view illustrating a semiconductor memory device according to example embodiments of inventive concepts, and FIG. 2 is an exploded perspective view illustrating the semiconductor memory device illustrated in FIG. 1.

Referring to FIGS. 1 and 2, the semiconductor memory device 1 according to example embodiments of inventive concepts may include a case 10 and a memory module 20. The case 10 may have an upper case 100 and a lower case 200. The memory module 20 may be held in an inner accommodating space formed by a coupling of the upper case 100 and the lower case 200. In accordance with example embodiments of inventive concepts, the semiconductor memory device 1 may be an SD card.

The upper case 100 and the lower case 200 may be formed of a plastic material, for example, a polycarbonate resin and/or an ABS resin. Moreover, the upper case 100 and the lower case 200 may be joined to each other by welding (or otherwise, melting and solidifying) the outside edges. An example of the welding operation may include an ultrasonic welding or a thermal welding.

The junction portion welded between the upper and lower cases 100 and 200 may prevent or reduce external static electricity from entering into the case 10 and may affect the mechanical strength, for example, a bending strength or a torsional strength of the case 10.

The memory module 20 built in the case 10 may include a card substrate 22 and a semiconductor device 24. The card substrate 22 may include a printed circuit board (PCB) formed of a plastic material, for example, a glass-epoxy resin and/or BT resin. A wiring network may be formed in the inside or upper and lower surfaces of the card substrate 22. An external connection terminal (not illustrated) may be provided at one side on the lower surface of the card substrate 22 so as to be exposed through an opening 230 of the lower case 200. A semiconductor device 24, for example, a flash memory or a controller, may be mounted on the upper surface of the card substrate 22. The external connection terminal (not illustrated) and the semiconductor device 24 may be electrically connected to the wiring network of the card substrate 22.

A switch knob 30 may be provided in the side portion of the case 10. The switch knob 30 may be used for a write protect and/or release of the semiconductor memory device 10. The position thereof may be adjusted in a sliding manner.

Figure 3:
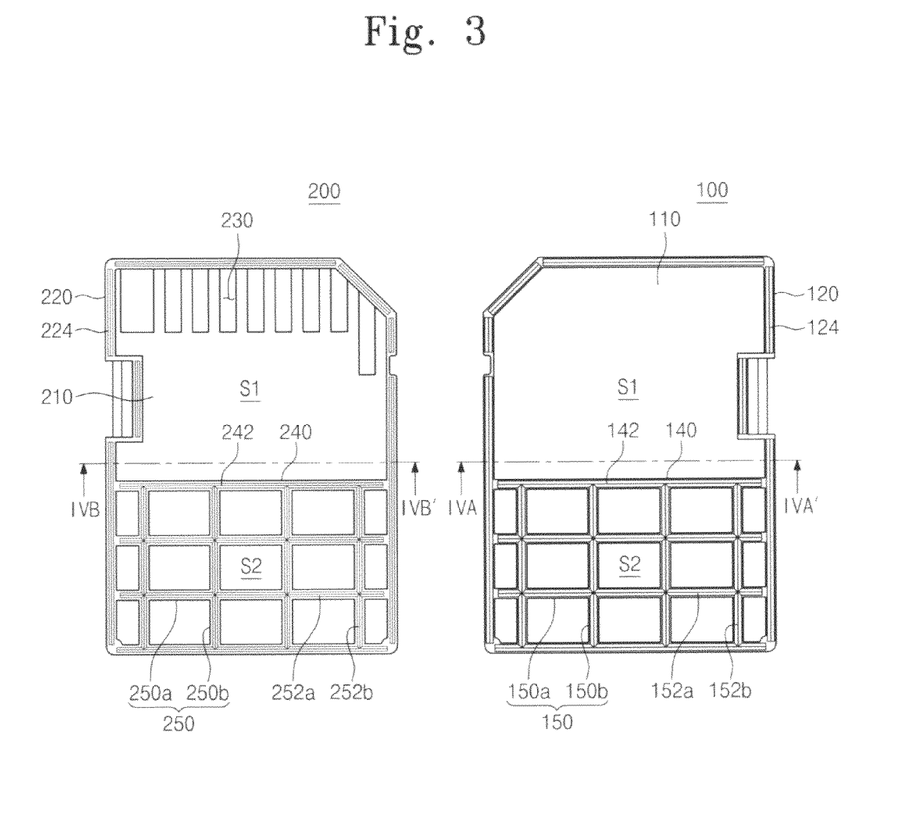
FIG. 3 is a plan view illustrating upper and lower cases illustrated in FIG. 2.

FIG. 3 is a plan view illustrating the upper case 100 and the lower case 200 illustrated in FIG. 2. In addition, FIG. 4A is a cross-sectional view of the upper case 100 taken along the IVA-IVA' line of FIG. 3, and FIG. 4B is a cross-sectional view of the lower case 200 taken along the IVB-IVB' line of FIG. 3.

Figure 4A:
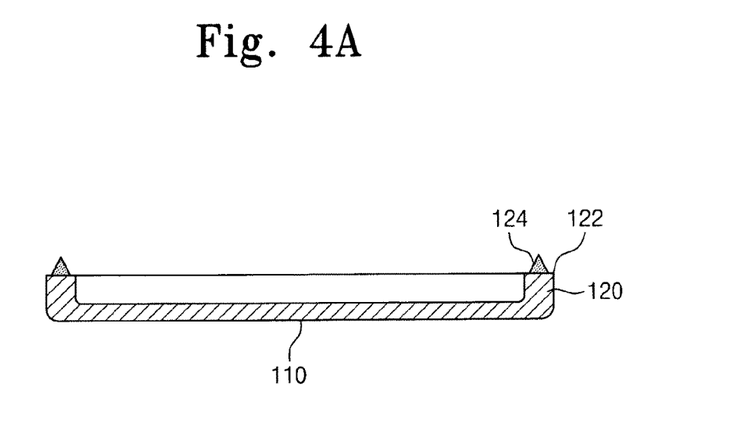
FIG. 4A is a cross-sectional view of the upper case taken along the IVA-IVA' line of FIG. 3.
Figure 4B:
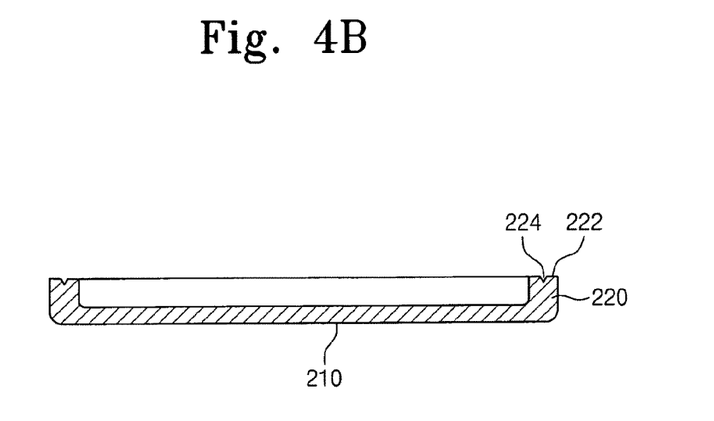
FIG. 4B is a cross-sectional view of the lower case taken along the IVB-IVB' line of FIG. 3.

Referring to FIG. 3, FIGS. 4A, and 4B, except for the opening 230, the plane structure of the upper case 100 is a mirror image with respect to that of the lower case 200. The upper case 100 includes a first body 110 having an approximately thin-rectangular plate shape and a first welding portion 120 formed so as to protrude along the outside edges of the first body 110. The first welding portion 120 may be successively protruded along the outside edges of the first body 110 or protruded so as to be intermittent at corners of the outside edges. The width of the first welding portion 120 may be constant, or otherwise, may vary depending on intermittent positions.

A welding protrusion 124 may be protruded from a first welding surface 122 directed in the protruding direction of the first welding portion 120. The welding protrusion 124 may be a triangle in section shape, but is not limited to thereto, and it may be formed to have various shapes, for example, a quadrangle or a trapezoid shape.

The lower case 200 includes a second body 210 having a mirror image shape with respect to the first body 110 of the upper case 100, and a second welding portion 220 protruding along the outside edges of the second body 210. The second body 210 may have a thin plate shape, and an opening 230 may be formed on one side of the second body 210 so as to expose an external connection terminal of the memory module 20 (not illustrated).

The second welding portion 220 may be successively protruded along the outside edges of the second body 210 or protruded so as to be intermittent at corners of the outside edges. The width of the first welding portion 220 may be constant, or otherwise, may vary depending on intermittent positions.

A welding groove 224 may be formed in the second welding surface 222 directed to the protruding direction of the second welding portion 220. The section of the welding groove 224 may be a triangle shape corresponding to the welding protrusion 124 of the first welding portion 120, but it is not limited to thereto, and it may be formed to have any other section shapes different from the welding protrusion 124.

The welding protrusion 124 formed at the first welding portion 120 of the upper case 100 has larger volume than the welding groove 224 formed at the second welding portion 220 of the lower case 200. Because the welding protrusion 124 has larger volume than the welding groove 224, the welding area is increased when the first welding portion 120 is joined to the second welding portion 220 by the welding (melting and solidifying). A detailed description thereof will be described below with reference to FIGS. 5 and 6.

FIG. 3 illustrates a case where the welding protrusion 124 is formed at the first welding portion 120 of the upper case 100 and the welding groove 224 is formed at the second welding portion 220 of the lower case 200. However, the welding protrusion 124 may be formed at the second welding portion 220 of the lower case 200, and the welding groove 224 may be formed at the first welding portion 120 of the upper case 100.

Figure 5A:
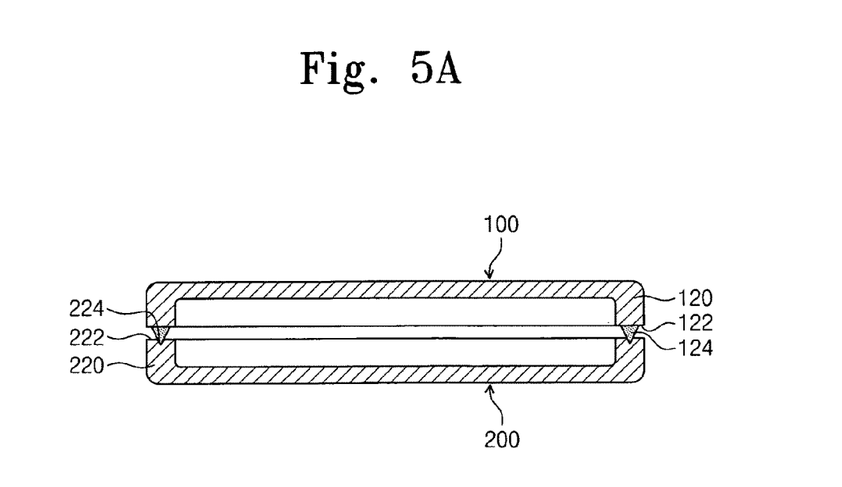
FIGS. 5A and 5B are diagrams illustrating processes where the upper case and the lower case are joined to each other by a welding.
Figure 5B:
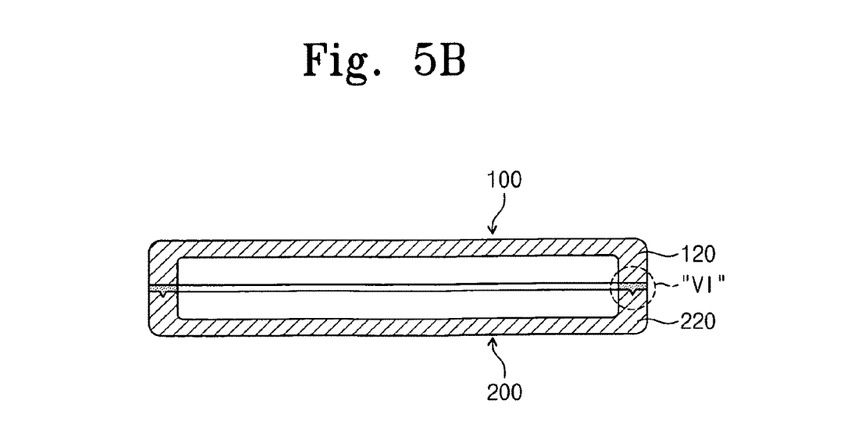
Figure 6:
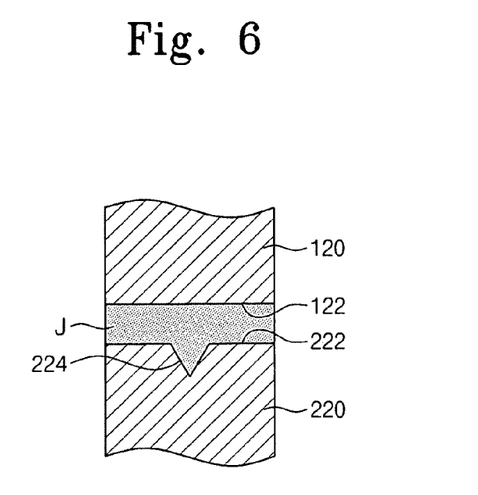
FIG. 6 is an enlarged view of a portion "VI" of FIG. 5B.

FIGS. 5A and 5B are diagrams illustrating processes where the upper case and the lower case are joined to each other by welding, and FIG. 6 is an enlarged view of a portion "VI" of FIG. 5B.

With respect to a process where the first welding portion 120 of the upper case 100 and the second welding portion 220 of the lower case 200 are joined to each other by welding (melting and solidifying), it will be described hereafter with reference to FIGS. 5A and 5B, and FIG. 6. An example of the welding may include ultrasonic welding using ultrasonic vibration energy.

The memory module (not illustrated) may be held in a space between the upper case 100 and the lower case 200, and the upper case 100 may be located on the lower case 200 such that a leading end of the welding protrusion 124 is inserted into the welding groove 224. Under this state, the upper case 100 may be pressed and at the same time ultrasonic vibration energy may be applied (see FIG. 5A).

A contact portion between the welding protrusion 124 and the welding groove 224 may be vibrated by the ultrasonic vibration energy, and the welding protrusion 124 may be molten by vibration friction. Because the welding protrusion 124 has larger volume than the welding groove 224, a portion of the molten welding protrusion 124 may fill in the welding groove 224 and the rest may fill a region between the first welding surface 122 of the first welding portion 120 and the second welding surface 222 of the second welding portion 220, thereby forming a junction portion (J). The junction portion (J) is solidified, and the first welding portion 120 of the upper case 100 and the second welding portion 220 of the lower case 200 is joined to each other by the solidified junction portion (J). In example embodiments of inventive concepts, the term "the molten welding protrusion 124" is also referred to as "a melt of a welding protrusion".

The junction portion (J) comes in contact with the first welding surface 122 of the first welding portion 120 and the second welding surface 222 and the welding groove 224 of the second welding portion 220. A contact area between the junction portion (J) and the second welding portion 220 may be larger than the contact area between the junction portion (J) and the first welding portion 120 due to the welding groove 224 (see FIGS. 5B and 6).

Figure 7A:
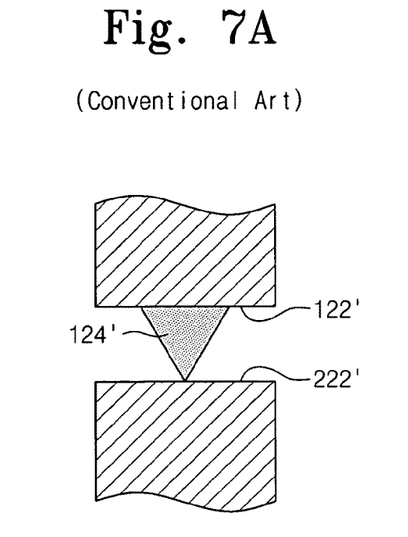
FIGS. 7A and 7B are views illustrating a known welding structure.
Figure 7B:
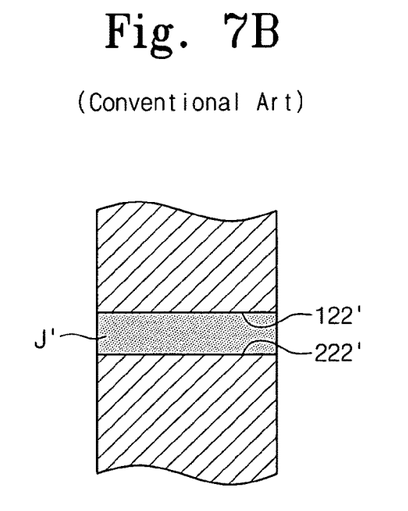

In the related art, as illustrated in FIG. 7A, a welding protrusion 124' is formed on any one surface 122' of welding surfaces 122' and 222', and the other one surface 222' has a plane shape. As illustrated in FIG. 7B, accordingly, the junction portion (J') coming in contact with the welding surface 122' has the same contact area as the junction portion (J') coming in contact with the welding surface 222'.

According to example embodiments of inventive concepts, however, the welding groove 224 is formed in the second welding surface 222, and the welding protrusion 124 formed in the first welding surface 122 has a volume larger than that of the welding groove 224. Accordingly, the welding area where the junction portion (J) comes in contact with the second welding surface 222 is enlarged in comparison to the related art.

When the welding area is enlarged, the welding strength between the first welding portion 120 and the second welding portion 220 is increased. Consequently, the mechanical strength, for example, a bending strength or a torsional strength, of the case 10, may be improved, thus, the durability of the case 10 may be improved.

Referring again to FIG. 3, the upper case 100 may have a first inner welding wall 140, and the lower case 200 may have a second inner welding wall 240. The first and second inner welding walls 140 and 240 may be provided as a separation wall, which partitions an accommodating space inside the case 10 into one space S1 holding the memory module 20 and the other space S2 not holding the memory module 20. Further, the inner welding walls 140 and 240 may be provided as different shapes at the position where the interior design of the upper and lower cases 100 and 200 is not restricted.

The first inner welding wall 140 may be protruded from the first body 110 of the upper case 100 so as to be horizontal in a longitudinal direction. The second inner welding wall 240 may be protruded from the second body 210 of the lower case 200 so as to face the first inner welding wall 140. The welding protrusion 142 may be formed on a surface of the first inner welding wall 140 facing the second inner welding wall 240, and the welding groove 242 may be formed on a surface of the second inner welding wall 240 facing the first inner welding wall 140. In the alternative, the welding groove may be formed at the first inner welding wall 140, and the welding protrusion may be formed at the second inner welding wall 240.

The first inner welding wall 140 and the second inner welding wall 240 may be joined to each other by welding the facing surfaces. Because the welding process is similar to the process described above with reference to FIGS. 5A and 5B, and FIG. 6, the description thereof will be omitted for the sake of brevity.

A strength reinforcing rib 150 may be provided in the upper case 100, and a strength reinforcing rib 250 may be provided in the lower case 200. The ribs 150 and 250 may be formed in a region corresponding to the space S2 in which the memory module 20 is not held.

The rib 150 provided in the upper case 100 may include first ribs 150a and second ribs 150b. The first ribs 150a and the second ribs 150b may be protruded from the first body 110 of the upper case 100. The first ribs 150a may be disposed so as to be horizontal in a longitudinal direction and be spaced apart from one another in parallel. The second ribs 150b may be disposed so as to be perpendicular to the first ribs 150a and be spaced apart from one another in parallel.

The rib 250 provided in the lower case 200 may include first ribs 250a and second ribs 250b. The first ribs 250a and the second ribs 250b may be protruded from the second body 210 of the lower case 200 so as to face the first ribs 150a and the second ribs 150b provided in the upper case 100.

The rib 150 provided in the upper case 100 may be joined to the rib 250 provided in the lower case 200 by welding the facing surfaces. Welding protrusions 152a and 152b may be formed on a surface of the rib 150 (150a and 150b) facing the rib 250 (250a and 250b), and welding grooves 252a and 252b may be formed on a surface of the rib 250 (250a and 250b) facing the rib 150 (150a and 150b). In the alternative, the welding grooves may be formed in the rib 150 (150a and 150b), and the welding protrusions may be formed in the rib 250 (250a and 250b). The welding process of the rib 150 and the rib 250 is similar to the process described above with reference to FIGS. 5A and 5B, and FIG. 6. Therefore, the description thereof will be omitted for the sake of brevity.

FIG. 3 illustrates a case where the welding protrusion or the welding groove is formed in the ribs, but the welding protrusion or the welding groove may be formed in only a portion of the ribs.

As described above, according to example embodiments of inventive concepts, the welding area between the first welding portion 120 and the second welding portion 220 is enlarged and the mechanical strength, for example, a bending strength or a torsional strength of the case 10, may be improved by virtue of the junction of the inner welding walls 140 and 240 and the junction of the strength reinforcing ribs 150 and 250 by using the similar welding structure.

Figure 8:
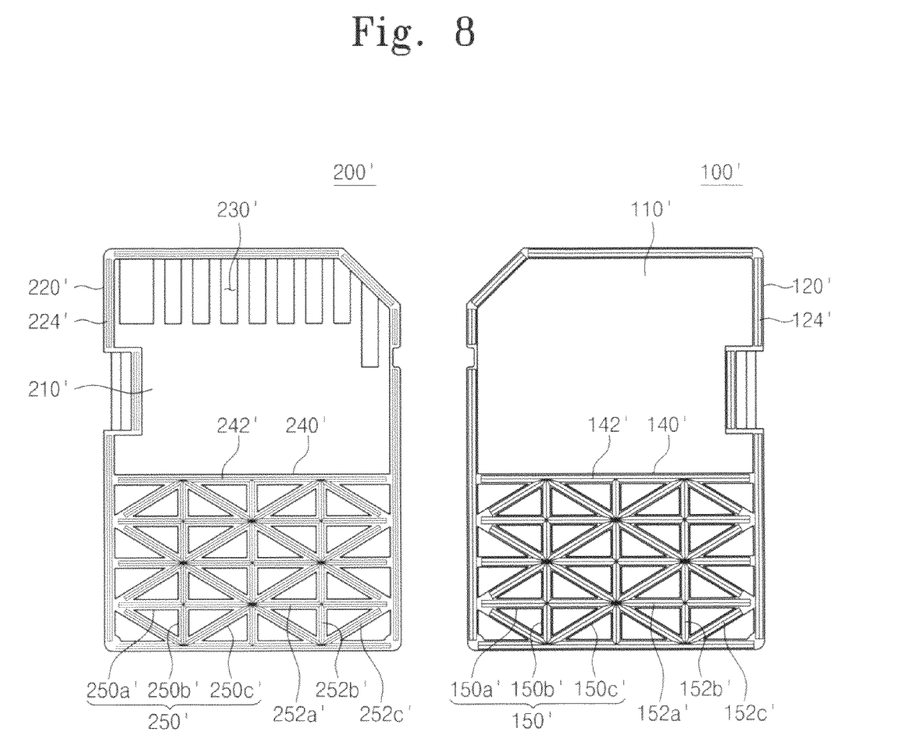
FIGS. 8 through 10 are plan views illustrating upper and lower cases according to example embodiments of inventive concepts.
Figure 9:
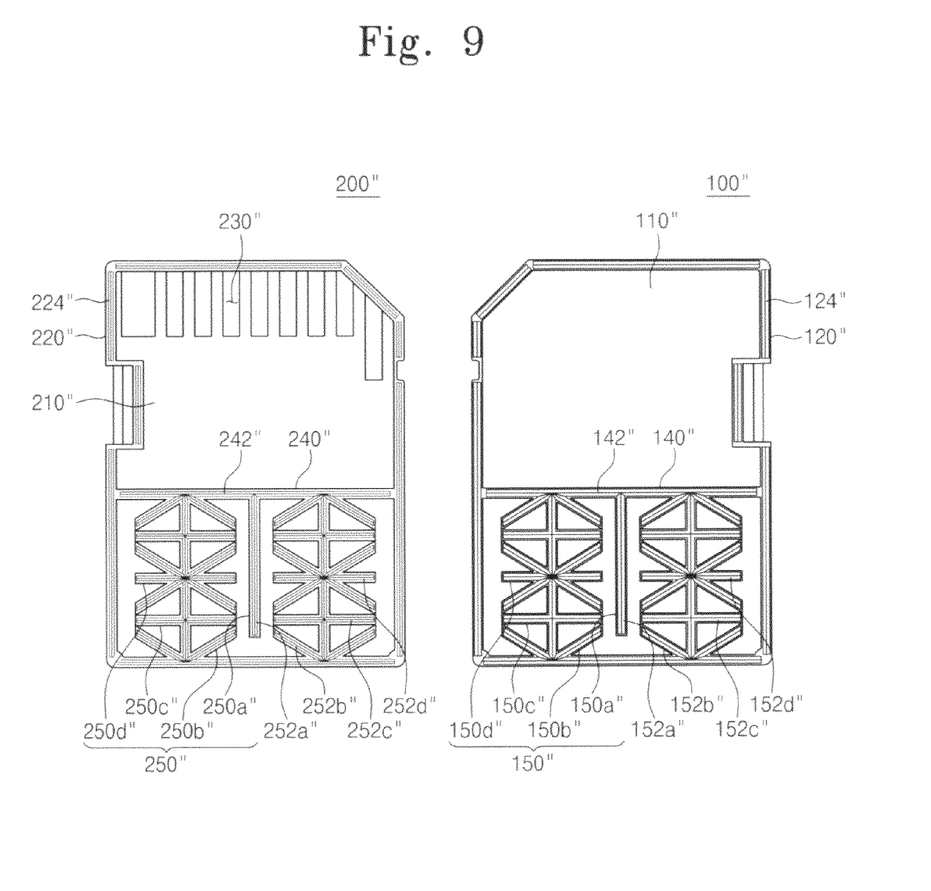
Figure 10:
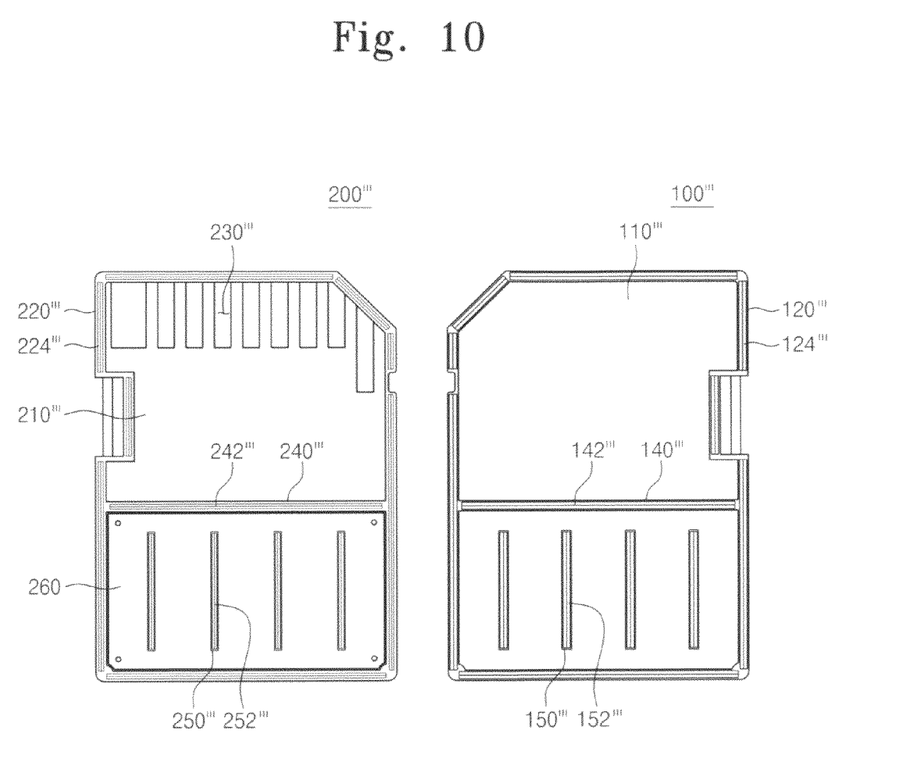

FIGS. 8 to 10 illustrate examples of upper cases and lower cases according to example embodiments of inventive concepts. The upper cases 100', 100", 100''' and the lower cases 200', 200", 200''' illustrated in FIGS. 8 to 10 are similar to the upper case 100 and lower case 200 illustrated in FIG. 3, except for the structure of the rib. Accordingly, only ribs having different structures will be described below.

As illustrated in FIG. 8, a rib 150' may be provided in the upper case 100'. The rib 150' may include first ribs 150a', second ribs 150b', and third ribs 150c'. The first ribs 150a', the second ribs 150b', and the third ribs 150c' are protruded from the first body 110' of the upper case 100'. The first ribs 150a' may be disposed so as to be horizontal in a longitudinal direction and be spaced apart from one another in parallel. The second ribs 150W may be disposed so as to be perpendicular to the first ribs 150a' and be spaced apart from one another in parallel. The third ribs 150c' may be disposed so as to connect intersection points, which are located at a diagonal direction, among intersection points between the first ribs 150a' and the second ribs 150b'.

A rib 250' may be provided in the lower case 200'. The rib 250' may include first ribs 250a', second ribs 250b', and third ribs 250c'. The first ribs 250a', the second ribs 250b', and the third ribs 250c' may be protruded from the second body 210' of the lower case 200' so as to face the first ribs 150a', the second ribs 150b', and the third ribs 150c' provided in the upper case 100'.

The rib 150' provided in the upper case 100' and the rib 250' provided in the lower case 200' may be joined to each other by welding the facing surfaces. The reference numeral 120' represents a first welding portion, and reference numeral 124' represents a welding protrusion, reference numeral 140' represents a first inner welding wall, reference numeral 142' represents a welding protrusion, reference numeral 220' represents a second welding portion, reference numeral 224' represents a welding groove, reference numeral 230' represents an opening, reference numeral 240' represents a second inner welding wall, and reference numeral 242' represents a welding groove, which are not described herein.

The rib 150' provided in the upper case 100' may be joined to the rib 250' provided in the lower case 200' by welding the facing surfaces. Welding protrusions 152a', 152b', and 152c' may be formed on a surface of the rib 150' (150a', 150b', and 150c') facing the rib 250' (250a', 250b', and 250c'), and welding grooves 252a', 252b', and 252c' may be formed on a surface of the rib 250' (250a', 250b', and 250c') facing the rib 150' (150a', 150b', and 150c'). In the alternative, the welding grooves may be formed in the rib 150' (150a', 150b', and 150c'), and the welding protrusions may be formed in the rib 250' (250a', 250b', and 250c'). The welding process of the rib 150' and the rib 250' is similar to the process described above with reference to FIGS. 5A and 5B, and FIG. 6. Therefore, the description thereof will be omitted for the sake of brevity.

As illustrated in FIG. 9, a rib 150" may be provided in an upper case 100", The rib 150" may include first to fourth ribs 150a", 150b", 150c", and 150d". The first to fourth ribs 150a", 150b", 150c", and 150d" may be protruded from a first body 110" of the upper case 100". The first ribs 150a" may be arranged so as to be perpendicular to the first inner welding wall 140". The second ribs 150b" may adjacently be arranged on both sides of the first rib 150a" along their longitudinal directions. The second ribs 150b" may have a diamond shape. The third ribs 150c" may be arranged so as to connect antipodes of the second ribs 150b". The fourth ribs 150d" may pass through contacts of the second ribs 150b" and may be arranged in a horizontal direction.

A rib 250" may be provided in a lower case 200". The rib 250" may include first to fourth ribs 250a", 250b", 250c", and 250d". The first to fourth ribs 250a", 250b", 250c", and 250d" may be protruded from a second body 210" provided in the lower case 200" so as to face the first to fourth ribs 150a", 150b", 150c", and 150d".

The rib 150" provided in the upper case 100" and the rib 250" provided in the lower case 200" may be joined to each other by welding the facing surfaces. The reference numeral 120" represents a first welding portion, and reference numeral 124" represents a welding protrusion, reference numeral 142" represents a welding protrusion, reference numeral 220" represents a second welding portion, reference numeral 224" represents a welding groove, reference numeral 230" represents an opening, reference numeral 240" represents a second inner welding wall, and reference numeral 242" represents a welding groove, which are not described herein.

The rib 150" provided in the upper case 100" may be joined to the rib 250" provided in the lower case 200" by welding the facing surfaces. Welding protrusions 152a", 152b", 152c", and 152d" may be formed on a surface of the rib 150" (152a", 152b", 152c", and 152d") facing the rib 250" (250a", 250b", 250c", and 250d"), and welding grooves 252a", 252b", 252c", and 252d" may be formed on a surface of the rib 250" (250a", 250b", 250c", and 250d") facing the rib 150" (150a", 150b", 150c", and 150d"). In the alternative, the welding grooves may be formed in the rib 150" (150a", 150b", 150c", and 150d"), and the welding protrusions may be formed in the rib 250" (250a", 250b", 250c", and 250d"). The welding process of the rib 150" and the rib 250" is similar to the process described above with reference to FIGS. 5A and 5B, and FIG. 6. Therefore, the description thereof will be omitted for the sake of brevity.

As illustrated in FIG. 10, a rib 150" provided in an upper case 100"' may be protruded from a first body 110' of the upper case 100"'. A plurality of ribs 150" may be disposed so as to be perpendicular to a first inner welding wall 140"' in a longitudinal direction and be spaced apart from one another in parallel. A rib 250"' may be provided in a lower case 200"' and may be protruded from a second body 210"' of the lower case 200' so as to face the rib 150"' provided in the upper case 100'. The rib 150"' provided in the upper case 100"' and the rib 250"' provided in the lower case 200"' may be joined to each other by welding the facing surfaces.

The rib 150" provided in the upper case 100"' may be joined to the rib 250"' provided in the lower case 200"' by welding the facing surfaces. Welding protrusions 152' may be formed on a surface of the rib 150" facing the rib 250"', and welding grooves 252"' may be formed on a surface of the rib 250' facing the rib 150"'. In the alternative, the welding grooves may be formed in the rib 150"', and the welding protrusions may be formed in the rib 250"'. The welding process of the rib 150" and the rib 250"' is similar to the process described above with reference to FIGS. 5A and 5B, and FIG. 6. Therefore, the description thereof will be omitted for the sake of brevity.

Figure 11:
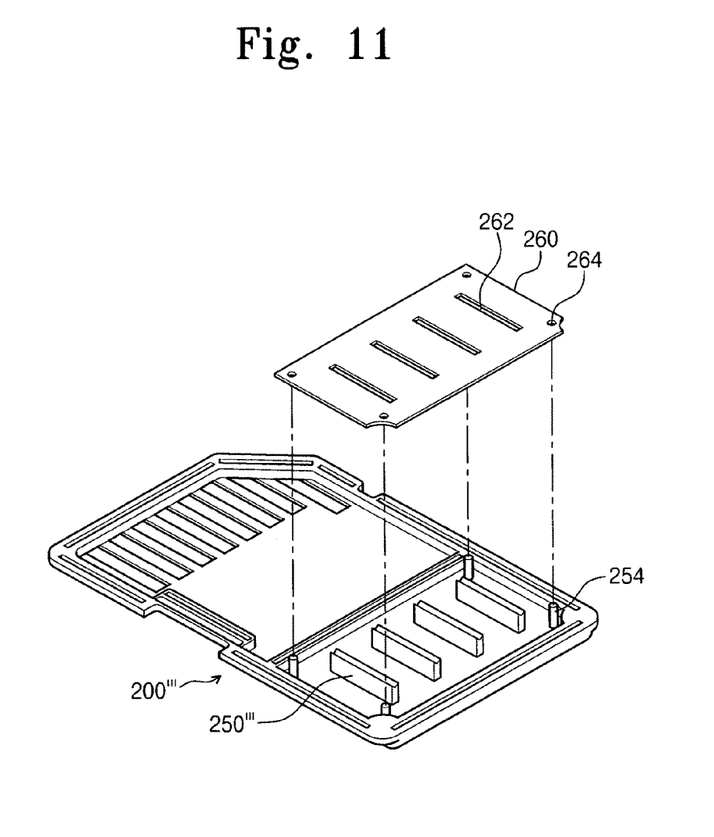
FIG. 11 is an exploded perspective view of the lower case illustrated in FIG. 10.

In addition to the rib 250"', a strength reinforcing member 260 may be provided in the lower case 200"'. The reinforcing member 260 may be a metallic plate. In the reinforcing member 260, as illustrated in FIG. 11, holes 262 may be formed so as to be penetrated by the ribs 250"', and holes 264 may be formed so as to be penetrated by pins 254 for fixing the reinforcing member 260. The reinforcing member 260 may be configured to come in contact with the second body 210' of the lower case 200' in a state where the ribs 250"' and the pins 254 are inserted into the holes 262 and 264. The reinforcing member 260 may be provided in the upper case 100"' with the same configuration as provided in the lower case 200"'.

The reference numeral 120' represents a first welding portion, reference numeral 124"' represents a welding protrusion, reference numeral 142' represents a welding protrusion, reference numeral 220"' represents a second welding portion, reference numeral 224" represents a welding groove, reference numeral 230"' represents an opening, reference numeral 240"' represents a second inner welding wall, and reference numeral 242" represents a welding groove, which are not described herein.

The above-described example embodiments of the inventive concepts describe the SD card as a semiconductor memory device, but are not limited thereto. The inventive concept may be applicable to various semiconductor memory devices capable of accommodating the substrate on which semiconductor devices are mounted in a pair of cases.

According to example embodiments of inventive concepts, the welding strength may be improved by enlarging the welding area of the welding portion of the case in the semiconductor memory device.

In addition, according to example embodiments of inventive concepts, it can improve the mechanical strength and durability of the case in the semiconductor memory device.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. A method of fabricating a semiconductor memory device, the method comprising:
forming a first welding groove along outside edges of one case of a pair of upper and lower cases;

forming a first welding protrusion along outside edges of the other case, the first welding protrusion being formed to correspond to the first welding groove and having a volume larger than a volume of the first welding groove;
inserting the first welding protrusion into the first welding groove;
melting the first welding protrusion so that a first portion of the first welding protrusion fills the first welding groove and a second portion of the first welding protrusion fills a space between welding portions of the upper case and the lower case; and
solidifying the first and second portions of the first welding protrusion,
wherein the upper and lower cases include inner welding walls protruding from inner sides of the outside edges of the upper and lower cases,
the inner welding wall of the upper case includes a first facing surface, and
the inner welding wall of the lower case includes a second facing surface facing the first facing surface,
wherein the inner welding walls partition an accommodating space into a holding space and a non-holding space, the accommodating space formed by coupling the upper and lower cases,
wherein strength reinforcing ribs are formed on the upper and lower cases corresponding to the non-holding space, and
wherein the ribs formed on the upper case have upper rib facing surfaces and the ribs formed at the lower cases have lower rib facing surfaces that face the upper rib facing surfaces,
a third welding groove is formed in one of the upper and lower rib facing surfaces, and a third welding protrusion is formed on the other of the upper and lower rib facing surfaces, the third welding protrusion having a volume larger than a volume of the third welding groove, and
the third welding protrusion is inserted into the third welding groove when the first welding protrusion is inserted in the first welding groove.

2. The method of claim 1, wherein
a second welding groove is formed in one of the first and second facing surfaces and a second welding protrusion is formed on the other of the first and second facing surfaces, the second welding protrusion having a volume larger than a volume of the second welding groove, and
the second welding protrusion is inserted into the second welding groove when the first welding protrusion is inserted in the first welding groove.

3. The method of claim 1, wherein the ribs include
a plurality of first ribs arranged horizontally in a longitudinal direction and spaced apart from one another in parallel; and
a plurality of second ribs arranged perpendicular to the plurality of first ribs and spaced apart from one another in parallel.

4. The method of claim 3, wherein the ribs further include third ribs arranged in a diagonal direction with respect to the first and second ribs, the third ribs connecting to points corresponding to the intersection of the first and second ribs.

5. The method of claim 1, wherein the ribs include
a first rib arranged perpendicular to one of the inner welding walls;
second ribs at both sides of the first rib, the second ribs having a diamond shape;
third ribs connecting antipodes of the second ribs; and
fourth ribs passing through contacts of the second ribs and arranged in a horizontal direction.

6. The method of claim 1, further comprising:
inserting a metallic plate-shaped reinforcing member into one of the upper and lower cases corresponding to the non-holding space, wherein the ribs penetrate the reinforcing member and are spaced apart from one another in parallel.

7. A method of fabricating a semiconductor memory device, the method comprising:
first welding a pair of upper and lower cases to each other to enclose a memory module in an inner accommodating space formed between the upper and lower cases,
wherein the first welding the pair of upper and lower cases to each other includes,
inserting a first welding protrusion formed on one of the cases of the pair of the upper and lower cases into a first welding groove formed in the other of the pair of the upper and lower cases, and
melting the first welding protrusion to fill the first welding groove, a volume of the first welding protrusion being larger than a volume of the first welding groove; and
second welding a pair of strength reinforcing ribs on the upper and lower cases to each other,
wherein the second welding strength reinforcing ribs protruding from the upper and lower cases to each other includes,
forming the ribs on the upper and lower cases,
forming a second welding groove in one of the ribs on the upper and the lower cases,
forming a second welding protrusion in the other of the ribs on the upper and the lower cases, the second welding protrusion having a volume larger than a volume of the second welding groove, and
inserting the second welding protrusion into the second welding groove when the first welding protrusion is inserted into the first welding groove.

8. The method of claim 7, further comprising:
forming the first welding groove on a welding surface of one of the cases of the pair of upper and lower cases; and
forming the first welding protrusion on a welding surface of the other of the cases of the pair of upper and lower cases.

9. The method of claim 8, wherein forming the first welding protrusion and the first welding groove include forming the welding protrusion and the welding groove along outside edges of the pair of upper and lower cases.

10. The method of claim 8, wherein forming the second welding protrusion and the second welding groove includes forming the welding protrusion and the welding groove on inner walls protruding from the upper and lower cases.

11. The method of claim 7, wherein the volume of the welding protrusion is large enough to fill the welding groove and cover the welding surface upon which the welding groove is formed.

12. The method of claim 1, wherein the melting the first welding protrusion forms a first portion and a second portion such that the first portion fills the first welding groove and a second portion extends both upwardly and laterally outwardly from the first welding groove to fill a space defined between the upper case and the lower case.

* * * * *